United States Patent [19]

Sokoler

[11] Patent Number: 6,073,001
[45] Date of Patent: Jun. 6, 2000

[54] DOWN CONVERSION MIXER

[75] Inventor: Izydor Sokoler, Copenhagen, Denmark

[73] Assignee: Nokia Mobile Phones Limited, Espoo, Finland

[21] Appl. No.: 09/074,859

[22] Filed: May 8, 1998

[30] Foreign Application Priority Data

May 9, 1997 [GB] United Kingdom .................... 9709464

[51] Int. Cl.[7] .................................................. H04B 1/30
[52] U.S. Cl. .......................... 455/323; 455/296; 455/303; 455/304; 455/306; 455/310; 455/313
[58] Field of Search ..................................... 455/296, 303, 455/304, 306, 310, 313, 317, 324, 209, 285, 302

[56] References Cited

U.S. PATENT DOCUMENTS

| | | | |
|---|---|---|---|
| 4,814,715 | 3/1989 | Kasperkovitz | 329/50 |
| 4,955,039 | 9/1990 | Rother et al. | 455/324 |
| 5,001,372 | 3/1991 | Nyqvist | 307/529 |
| 5,033,110 | 7/1991 | Harman | 455/114 |
| 5,303,417 | 4/1994 | Laws | 455/314 |
| 5,379,458 | 1/1995 | Vaisanen | 455/330 |
| 5,428,833 | 6/1995 | Reitberger et al. | 455/304 |
| 5,430,895 | 7/1995 | Huusko | 455/327 |
| 5,850,598 | 12/1998 | Behrent | 455/324 |

FOREIGN PATENT DOCUMENTS

| | | |
|---|---|---|
| 0 006 760 A1 | 1/1980 | European Pat. Off. . |
| 0 196 098 A2 | 10/1986 | European Pat. Off. . |
| 2 704 375 A1 | 10/1994 | France . |
| 2 148 064 | 5/1985 | United Kingdom . |
| 2249679 | 5/1992 | United Kingdom .................... 455/313 |

OTHER PUBLICATIONS

Patent Abstracts of Japan JP 08037425 A.
European Search Report.
United Kingdom search report.

*Primary Examiner*—Fan Tsang
*Assistant Examiner*—Marceau Milord
*Attorney, Agent, or Firm*—Perman & Green, LLP

[57] ABSTRACT

A quadrature down converter comprises two channels, each of said channels comprising two parallel signal paths. Each of said signal path comprises a mixer mixing the signal for down conversion with an oscillator signal. In the in-phase channel the mixers receive the oscillator signal shifted 0° and 180° in phase, respectively. In the quadrature-phase channel the mixers receive the oscillator signal shifted 90° and 270° in phase, respectively. By filtering and combining (adding/subtracting) the signals from the signal paths in each of said channels, the disturbing second order terms from the mixers may be substantially eliminated.

11 Claims, 2 Drawing Sheets

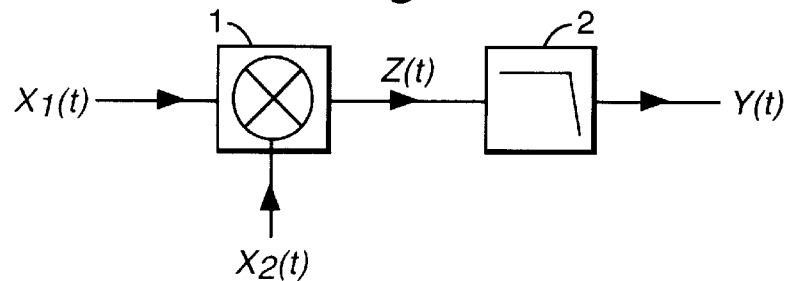
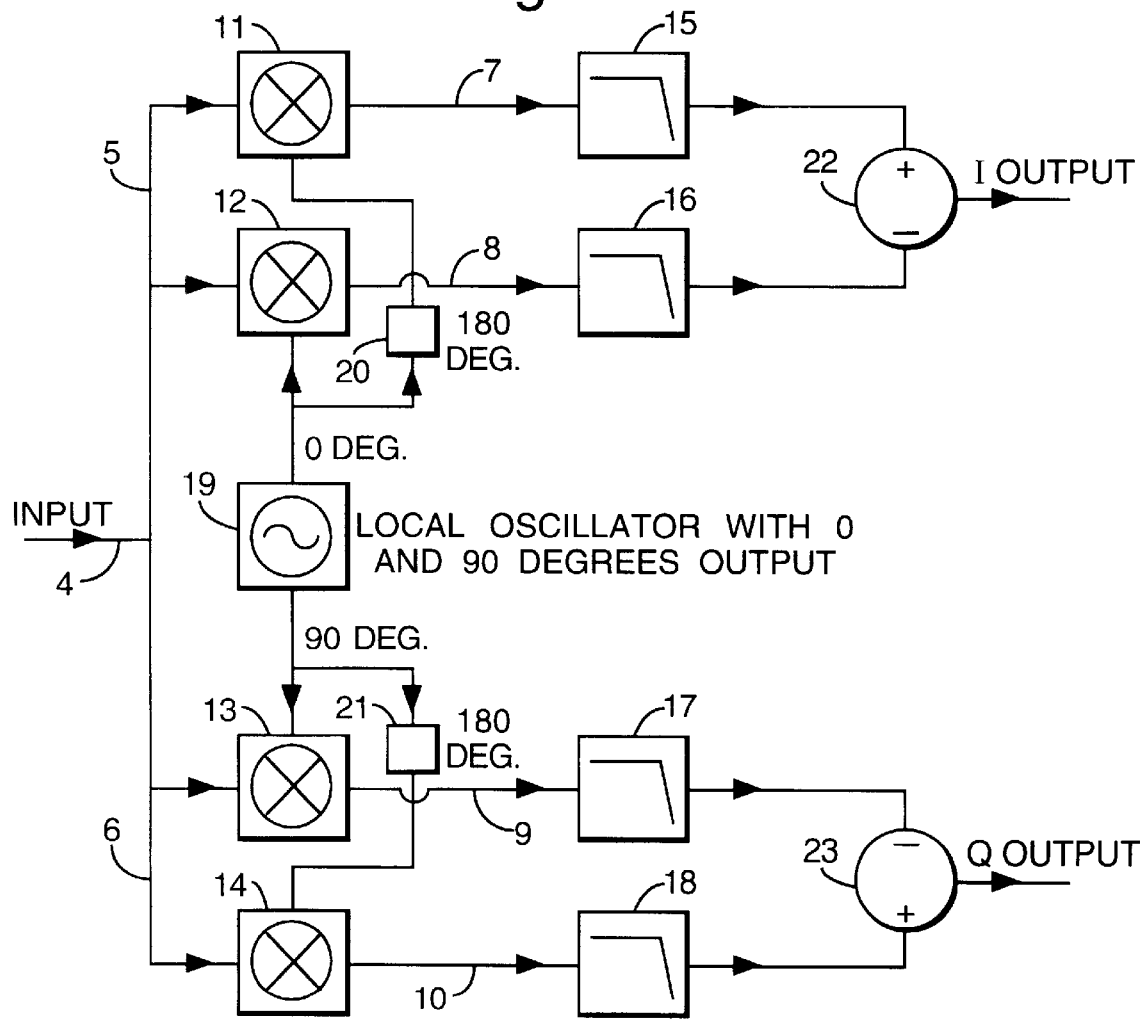

DOWN CONVERSION MIXER

BACKGROUND OF THE INVENTION

The invention relates to a method of down-converting a high-frequency signal, and a down conversion mixer and especially a quadrature down conversion mixer for carrying out the method. The invention furthermore relates to a phone having such a down conversion.

In a traditional super heterodyne receiver, non-linearities of second order will result in mixer products that are far away in frequency from the IF signal at the output. These undesired signals can therefore be removed by the IF filter. The dominant non-linearities in the conventional super heterodyne receivers are therefore the 3rd order intermodulation products.

In a direct conversion receiver, however, mixer non-linearities of second order will result in the down conversion of any signal, presented to the mixer input, to a baseband signal. A pure carrier will thus give rise to a DC signal at the output, while an AM modulated signal will result in a low-pass baseband signal whose spectral contents might overlap the desired signal.

High suppression of second order products in the mixer is therefore of great importance, and lack of sufficient second order suppression has often been one of the reasons why the direct conversion receiver has been discarded as a realistic alternative to the conventional super heterodyne receiver.

Generally, the manufacturers of the mixers are able to suppress the second part of the expression (8) to a level which is 40–50 dB below the level of the first part of the expression. However, in GSM phase II an AM rejection to at least 70 dB is required.

SUMMARY OF THE INVENTION

In accordance with an aspect of the invention there is provided a method comprising branching the signal into two parallel signal paths, providing an oscillator signal, mixing the signal in each of said two parallel signal paths with the oscillator signal relatively shifted 0° and 180°, respectively, low-pass filtering the signals, and combining said two signals into a single output signal such that the second order effects are substantially leveled out. By combining the signals from the two signal paths, a substantial suppression of the second order mixing products may be obtained.

The invention provides a method which can be used to obtain very high suppression of second order non-linearities in a down conversion mixer.

In accordance with a second aspect of the present invention there is provided a method of down-converting a high-frequency signal and comprising branching the signal into four parallel signal paths, providing an oscillator signal, mixing the signal in each of said four parallel signal paths with the oscillator signal relatively shifted 0°, 90°, 180° and 270°, respectively, combining said four parallel signal paths into two channels, each with two signal paths with the oscillator signal relatively shifted 180°, and for each channel combining the signals in the two signal paths to provide an output signal for the respective channel. The invention is based on the fact that the undesired second order mixing product present in the baseband is unaffected by the phase of the signal from the local oscillator. By providing an extra mixing path in each channel it is possible to establish signals including both the transmitted, phase-modulated signal and the second order mixer product present in the baseband, where said two terms have the same and the opposite sign in the two mixing paths, respectively. After the combination, a suppression of the second order mixing product compared with the transmitted signal may be of the order of 70 dB or even higher, when two substantially identical mixers are used.

This provides a method which can be used to obtain very high suppression of second order non-linearities in an integrated IQ mixer for direct conversion receivers.

The invention furthermore relates to a converter channel comprising two parallel signal paths provided with a first mixer unit and a second mixer unit, respectively. An oscillator provides an oscillator signal for the two mixer units, said first and second mixer units receiving said oscillator signal with a relative phase shift of 180°. The output from the mixers is combined in a combination unit which provides an output signal with improved suppression of the second order effect. The disturbing second order term is substantially leveled out by subtracting the two subchannel signals from each other.

The invention furthermore relates to a quadrature down converter comprising an input for receiving a signal for down conversion; a branch for branching the signal received on the input into two channels, each of said channels comprising two parallel signal paths; and an oscillator for providing an oscillator signal for use in mixer units. The first one of said two signal paths in each of said channels is provided with a first mixer unit for down-converting the signal in the path, said first mixers receiving said oscillator signal with a relative phase shift of 90° relative to each other. The second signal path in each of said channels is provided with a second mixer unit for down-converting the signal in the path, said second mixer in said two channels receiving said oscillator signal with a relative phase shift of 180° relative to the first mixer in the same channel. A combination unit in each channel provides an output signal for the respective channel by combining the signals in the two paths of the channel.

BRIEF DESCRIPTION OF THE DRAWINGS

The invention will be explained more fully below in connection with a preferred embodiment and with reference to the drawing, in which:

FIG. 1 illustrates the basics of a mixer;

FIG. 3 illustrates the structure of a first embodiment of a quadrature IQ down mixer according to the invention.

In FIG. 1, a simple mixer 1 followed by a low-pass filter 2 is shown. In a direct conversion receiver, the desired input signal is centered around the same frequency as the local oscillator frequency.

Figure 2:
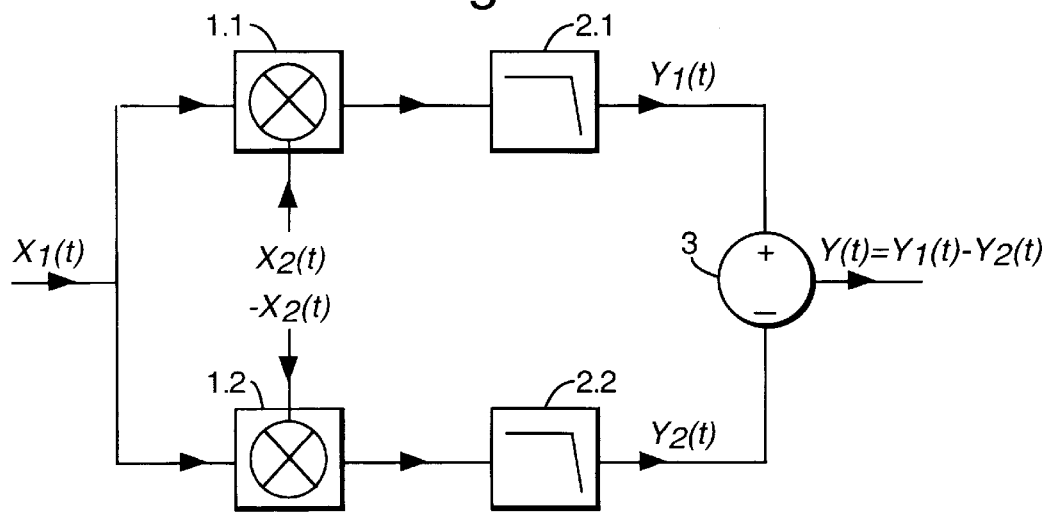
FIG. 2 illustrates the structure of a first embodiment of a converter according to the invention.

Now let us define the following signals:

$$\text{Desired input signal: } S_w(t) = m_0(t)\cos(\omega_0 t + \phi_0(t)) \quad (1)$$

$$\text{Undesired input signal: } S_u(t) = m_1(t)\cos(\omega_1 t + \phi_1(t)) \quad (2)$$

$$\text{Local oscillator: } S_{lo}(t) = K\cos(\omega_0 t + \phi_2) \quad (3)$$

Here the desired and the undesired signals are arbitrary phase- and amplitude-modulated signals, while the local oscillator has a constant phase and amplitude. It is further assumed that the distance in frequency between the undesired and the desired signal is greater than the cut-off frequency of the low-pass filter at the output.

If non-linearities up to the 3rd order are taken into consideration, the mixer operation can be described by the general expression:

$$Z = aX_1 + bX_2 + cX_1^2 + dX_2^2 + eX_1X_2 + fX_1X_2^2 + gX_1^2X_2 + hX_1^3 + pX_2^3 + \text{fourth and higher order mixer products,} \quad (4)$$

where $X_1$ is the input signal, $X_2$ the local oscillator signal and Z the mixer output.

In the above equation (4), the first two terms represent a non-infinite isolation from respectively the input and the local oscillator port to the output port, while the 3rd and the 4th terms represent the disturbing second order non-linearities. The 5th term represents the desired mixer operation, while the 6th, 7th, 8th and 9th terms represent 3rd order effects.

If we now insert: $X_1(t) = S_w(t) + S_u(t)$ and $X_2(t) = S_{lo}(t)$ and we look at the output signal, Y(t), after the low-pass filtering, we get the following expression:

$$Y(t) = \tfrac{1}{2}dK^2 + \tfrac{1}{2}cm_0^2(t) + \tfrac{1}{2}cm_1^2(t) + \tfrac{1}{2}eKm_0(t)\cos(\omega_0(t) - \phi_2) \quad (5)$$

In this expression, the following observations can be made:

$\tfrac{1}{2}dK^2$ is a pure DC contribution which, for a given mixer, only depends on the local oscillator level.

$\tfrac{1}{2}cm_0^2(t)$ is a signal coming from the squared amplitude modulation of the desired input signal. Its spectrum is located around DC.

$\tfrac{1}{2}cm_1^2(t)$ is a signal coming from the squared amplitude modulation of the undesired signal. Its spectrum is located around DC.

$\tfrac{1}{2}eKm_0(t)\cos(\phi_0(t) + \phi_2)$ is the desired signal, down-converted to baseband, and subjected to a phase shift.

It will be seen that all the undesired components at the output of the low-pass filter come from second order effects in the mixer, and are thus related to the 2nd order intercept point of the mixer and the lack of isolation between the RF and the LO ports.

Reference is now made to the diagram shown in FIG. 2, in which two parallel branches each contain a simple mixer 1.1 and 1.2, respectively, followed by a low-pass filter 2.1 and 2.2, respectively. The sign of the oscillator signal fed to the two mixers 1.1 and 1.2 is plus and minus, respectively. This corresponds to a 180° phase shift. The same mathematical calculations as above are carried out for the two branches. The following results are obtainable:

$$Y_1(t) = \tfrac{1}{2}dK^2 + \tfrac{1}{2}cm_0^2(t) + \tfrac{1}{2}cm_1^2(t) + \tfrac{1}{2}eKm_0(t)\cos(\phi_0(t) - \phi_2), \text{ and}$$

$$Y_2(t) = \tfrac{1}{2}dK^2 + \tfrac{1}{2}cm_0^2(t) + \tfrac{1}{2}cm_1^2(t) - \tfrac{1}{2}eKm_0(t)\cos(\phi_0(t) - \phi_2) \quad (6)$$

It will be seen that the only difference in the two expressions is that the desired output term changes its sign. The undesired terms are not dependent upon the phase of the local oscillator signal and are thus unchanged.

Now by simple subtraction in a combination unit or a subtraction unit 3, we get:

$$Y(t) = Y_1(t) - Y_2(t) \quad (7)$$
$$= eKm_0(t)\cos(\varphi_0(t) - \varphi_2)$$

As will be seen, the result is that the undesired components have been eliminated and only the desired down-converted baseband signal is left. It can be shown that most of the disturbing terms from higher even order non-linearities are canceled as well.

In the figure the final improved IQ down mixer for direct conversion is shown. The traditional quadrature IQ down mixer has now been replaced by a new circuit, where each branch now consists of the improved structure, discussed above.

It is important that the final IC layout is done with care so that the four mixers operate under equal conditions. However, it can be shown that even if the mixers are not totally matched concerning gain and phase, a very considerable improvement in second order suppression will still be obtained.

A first embodiment of a quadrature IQ down mixer according to the invention is shown in FIG. 3. This embodiment of the quadrature IQ down mixer is used in a receiver for a hand portable phone which may communicate with a cellular network, e.g. the GSM network. As will be seen from FIG. 3, the down mixer receives an input signal for down conversion from an RF part (not shown) and delivers a down-converted quadrature signal to a Digital Signal Processing unit (DSP—not shown). When the converter is used in a GSM phone, the received signal may be described by the sum of the expressions (1) and (2). $M_0(t)$ and $m_1(t)$ are the amplitudes of the envelope curves, and these may vary over time. The signal acts as if it is amplitude-modulated, but there is no information present in the amplitude modulation.

The signal received by the down mixer may be the RF signal received by the RF unit, whereby the carrier frequency, $\omega_0/2\pi$, will be within the frequency band 935–960 MHz depending on the transmission channel. This requires that the local oscillator may be adjusted to correspond to the channel used. Alternatively, the RF part 2 may down-convert the RF signal to an IF signal with a fixed carrier frequency, e.g. of the order of 400 MHz. Then the local oscillator has to be stable on the same frequency. ($\phi_0(t)$ is the phase modulated information-carrying signal.

However in the shown embodiment, the down mixer is used as a quadrature converter which receives a signal with a carrier frequency of 400 MHz. From the input of the converter, a branch 4 branches the signal into two channels 5 and 6. The two channels 5 and 6 define an I channel and a Q channel, respectively. Both the I channel and the Q channel comprise two parallel signal paths, whereby the down mixer according to the invention comprises four parallel and identical signal paths 7–10.

Each of said paths 7–10 comprises a mixer 11–14 in which the input signals (1) and the oscillator signals are mixed. The high frequencies are subsequently removed by respective low-pass filters 15–18.

A local oscillator 19 generates a sine signal with a frequency corresponding to the carrier of the input signal. Local oscillators for quadrature converters outputting both an in-phase oscillator signal and a 90° shifted oscillator signal are presently available. The in-phase output from the local oscillator 19 is fed to the I channel 5. Here the local oscillator output is fed directly to the mixer 12 in the first path and is fed to the mixer 11 shifted 180° in phase by means of a phase shifter 20. Accordingly, the output from the low-pass filter 15 may be expressed on the basis of the expression (8) and be as follows:

$$Y_{15}(t) = \tfrac{1}{2}em_0(t)k_0\cos(\varphi(t) - 180°) + \tfrac{1}{2}dK^2 + \tfrac{1}{2}cm_0^2(t) + \tfrac{1}{2}cm_1^2(t) \quad (8)$$
$$= -\tfrac{1}{2}em_0(t)k_0\cos\varphi(t) + \tfrac{1}{2}dK^2 + \tfrac{1}{2}cm_0^2(t) + \tfrac{1}{2}cm_1^2(t)$$

where $\tfrac{1}{2}em(t)k_0\cos(\phi(t)$ is the down-converted in-phase signal, and $\tfrac{1}{2}dK^2$, $\tfrac{1}{2}cm_0^2(t)$ and $\tfrac{1}{2}cm_1^2(t)$ are time-varying contributions depending on the mixer and the amplitude of the received signal and the oscillator signal.

Similarly, the output from the low-pass filter 16 may be expressed as:

$$Y_{16}(t) == \tfrac{1}{2}em_0(t)k_0\cos\varphi(t) + \tfrac{1}{2}dK^2 + \tfrac{1}{2}cm_0^2(t) + \tfrac{1}{2}cm_1^2(t) \quad (9)$$
$$= \tfrac{1}{2}em_0(t)k_0\cos\varphi(t) + \tfrac{1}{2}dK^2 + \tfrac{1}{2}cm_0^2(t) + \tfrac{1}{2}cm_1^2(t)$$

The output from the I channel may be found by subtracting the output from the first low-pass filter 15 from the output from the second low-pass filter 16 in a subtraction unit 22. The resulting output from the subtraction unit 22 will therefore be:

$$Y_{I-channel}(t) = Y_{16}(t) - Y_{15}(t) \quad (10)$$
$$= em_0(t)k_0\cos\varphi(t)$$

Similar considerations may be made for the Q channel. The quadrature output (shifted 90° in phase) is fed to the Q channel 6 from the local oscillator 19. Here the local oscillator output is fed directly to the mixer 13 and to the mixer 14 shifted 180° in phase by means of a phase shifter 21. Accordingly, the output from the low-pass filter 17 may be expressed on the basis of the expression (8) and be as follows:

$$Y_{17}(t) = \tfrac{1}{2}em_0(t)k_0\cos(\varphi(t) - 90°) + \tfrac{1}{2}dK^2 + \tfrac{1}{2}cm_0^2(t) + \tfrac{1}{2}cm_1^2(t) \quad (11)$$
$$= -\tfrac{1}{2}em_0(t)k_0\sin\varphi(t) + \tfrac{1}{2}dK^2 + \tfrac{1}{2}cm_0^2(t) + \tfrac{1}{2}cm_1^2(t),$$

where $\tfrac{1}{2} em_0(t)k_0\sin\phi(t)$ is the down-converted quadrature signal, and $\tfrac{1}{2}dK^2$, $\tfrac{1}{2}cm_0^2(t)$ and $\tfrac{1}{2}cm_1^2(t)$ are time-varying contributions depending on the mixer and the amplitude of the received signal and the oscillator signal. Similarly, the output from the low-pass filter 18 may be expressed as:

$$Y_{18}(t) = \tfrac{1}{2}em_0(t)k_0\cos(\varphi(t) - 270°) + \tfrac{1}{2}dK^2 + \tfrac{1}{2}cm_0^2(t) + \tfrac{1}{2}cm_1^2(t) \quad (12)$$
$$= -\tfrac{1}{2}em_0(t)k_0\sin\varphi(t) + \tfrac{1}{2}dK^2 + \tfrac{1}{2}cm_0^2(t) + \tfrac{1}{2}cm_1^2(t)$$

The resulting output from the Q channel may be found by subtracting the output from the first low-pass filter 17 from the output from the second low-pass filter 18 in a subtraction unit 23.

$$Y_{Q-channel}(t) = Y_{18}(t) - Y_{17}(t) \quad (13)$$
$$= em_0(t)k_0\sin\varphi(t).$$

It can be seen from the expressions (10) and (13) that a complete removal of the amplitude-modulated second order mixer products is obtained.

A simple method for high suppression of second order effects in an IQ mixer for direct conversion receivers has been devised. The method is particularly suitable for implementation in integrated circuit technology, where component tolerances and layout differences on the same substrate can be minimized.

Figure 4:
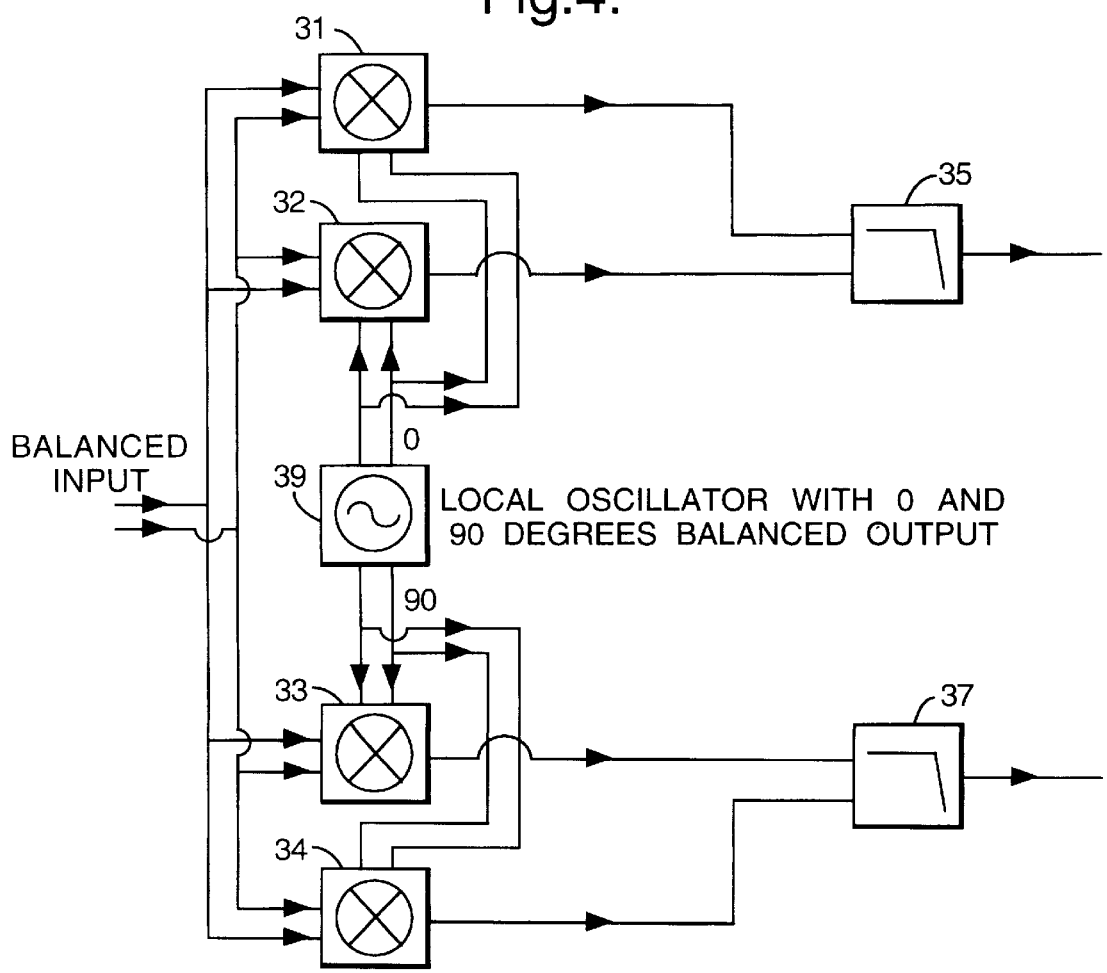
FIG. 4 illustrates the structure of a second and preferred embodiment of the quadrature IQ down mixer according to the invention.

A second and preferred embodiment of the quadrature down mixer according to the invention is shown in FIG. 4. This embodiment comprises two channels each having two parallel signal paths receiving the oscillator signal shifted relatively 180°. All four mixers 31–34 are identical to each other. The mixers 31–34 receive a balanced input —both from the RF part and from the oscillator 39—and output a single ended output signal.

Due to the balanced inputs to the mixers 31–34, the 180° phase shift of the oscillator signal is obtained by turning the polarity of the balanced input from the oscillator 39 to the mixers 31 and 34. Similarly, the polarity of the balanced input from the RF front (not shown) to the mixers 31 and 34 is turned. Hereby the sign of the output from the mixers 31 and 34 will have a sign opposite to that of the output from the mixers 32 and 33.

The amplitude-modulated second order mixer products may be removed by a simple superposition of the output from the mixers in the I and Q channels, respectively. By performing the superposition before the low-pass filtering two low-pass filters may be saved. Each channel has a low-pass filter 35 and 37, respectively.

The I and the Q channels will output the signal given in equations (10) and (13).

In view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. A method of down-converting a received, high-frequency signal with improved suppression of time varying second order effects, the method comprising the steps of:

branching the received signal into first and second branched signals having respective first and second parallel signal paths;

providing oscillator signals;

mixing said branched signals in said first and second parallel signal paths with the oscillator signals, said oscillator signals being relatively shifted 0° and 180°, respectively for said first and second branched signals, respectively;

low-pass filtering said mixed first and second branched signals; and combining said filtered first and second branched signals into a single output signal such that the second order effects are substantially leveled out, the step of combining comprising superposing each of said filtered first and second branched signals wherein the desired down-converted signal components are added to each other while the time varying second order effects are subtracted out from each other.

2. A method according to claim 1, wherein said step of branching the received signal comprises:

branching the received signal into two channels, each channel having its own respective ones of the first and second parallel signal paths, said two channels being provided as an in-phase channel (I channel) and a quadrature channel (Q channel-shifted 90° compared with the I channel); and wherein said combining step includes combining said first and second parallel signal paths in each of said channels, for providing I and Q signals with improved suppression of the second order effects.

3. A method according to claim 2, wherein mixers in each of the first and second parallel signal paths are adapted to receive balanced inputs and provide a single ended output, and wherein the polarity of both the oscillator signals and the received high-frequency signal is inverted for one of said first and second parallel signal paths, and wherein the single ended output signal from each of the mixers are superposed prior to said low pass filtering step.

4. A method according to claim 1, wherein the first and second filtered branched signals are combined into a single output signal by subtracting the first branched signal mixed with the oscillator signal relatively shifted 0° from the second branched signal mixed with the oscillator signal relatively shifted 180°.

5. A quadrature down converter comprising:
an input for receiving a signal for down conversion;
a branch for branching the signal received on the input into two channels, each of said channels comprising a first and a second parallel signal path;
an oscillator for providing oscillator signals for use in mixer units;
the first signal path in each of said channels being each provided with a first mixer unit for down-converting a signal in the first signal path, said first mixer in said first channel receiving a first oscillator signal with a relative phase shift of 90° relative to a second oscillator signal to said first mixer in said second channel;
the second signal path in each of said channels being provided with a second mixer unit for down-converting a signal in the second signal path, each of said second mixers in said two channels receiving an oscillator signal with a relative phase shift of 180° relative to the first mixer in the same channel; and
a combination unit in each channel for providing an output signal for the respective channel by combining the signals in the first and second parallel signal paths of the channel, said combination unit being adapted to superpose said signals in the first and second parallel signal paths of each channel in order to add desired down-converted signal components to each other, while time varying second parallel order effects are subtracted from each other and are substantially leveled out.

6. A converter according to claim 5, wherein the oscillator is provided with first and second outputs, and wherein the second output is shifted 90° in phase compared with the first output.

7. A converter according to claim 5, wherein the combination units subtract the first and second parallel signals in said two parallel signal paths from each other.

8. A converter according to claim 5, wherein said first and second mixer units are adapted to receive balanced inputs and provide a single ended output, in each of said two channels, and wherein said relative phase shift of 180° between the oscillator signals received by the first and second parallel mixers in the first and second signal paths is obtained by inverting the polarity of the mixer input for the oscillator signal for said first mixer relative to said second mixer.

9. A converter according to claim 8, wherein the polarity of an input of one of the first and second parallel signal paths in each channel for the received signal for down conversion is shifted 180° in phase relative to the other, and wherein the single ended outputs from the first and second mixers are added to obtain an output signal of the channel.

10. A cellular phone including a quadrature down converter comprising:
an input for receiving a signal for down conversion;
a branch for branching the signal received on the input into two channels, each of said channels comprising a first and a second parallel signal path;
an oscillator for providing oscillator signals for use in mixer units;
a first mixer unit in each first signal path in each of said channels for down-converting a signal in the first signal path, said first mixer in said first channel receiving a first oscillator signal with a relative phase shift of 90° relative to a second oscillator signal to said first mixer in said second channel;
a second mixer unit in each second signal path in each of said channels for down-converting a signal in the second signal path, each of said second mixers in said two channels receiving an oscillator signal with a relative phase shift of 180° relative to the first mixer in the same channel; and
a combination unit in each channel for providing an output signal for the respective channel by combining the signals in the first and second signal paths of the channel, said combination unit adapted to superpose said signals in the first and second signal path of each channel in order to add the desired down-converted signal components to each other, while the time varying second order effects are subtracted from each other and are thereby substantially leveled out.

11. A method of using a cellular phone comprising the steps of:
providing a converter having an input for receiving a signal for down conversion in a Global System for Mobile Communications (GSM) phone fulfilling the phase II requirements given in the GSM specifications, said converter comprising;
a branch for branching the signal received on the input into two channels, each of said channels comprising a first and a second parallel signal path;
an oscillator for providing oscillator signals for use in mixer units;
a first mixer unit in the first signal path in each of said channels for down-converting a signal in the first signal path, said first mixer in said first channel receiving an oscillator signal with a relative phase shift of 90° relative to a second oscillator signal to said first mixer in said second channel;
a second mixer unit in the second signal path in each of said channels for down-converting a signal in the second signal path, said second mixers in each of said two channels receiving an oscillator signal with a relative phase shift of 180° relative to the first mixer in the same channel; and
a combination unit in each channel for providing an output signal for the respective channel by combining the signals in the first and second signal paths of the channel, said combination unit adapted to superpose said signals in the first and second parallel signal path of each channel in order to add the desired down-converted signal components to each other, while the time varying second parallel order effects are subtracted from each other and are thereby substantially leveled out;
providing power to said cellular phone;
dialing a phone number for a user of a phone system;
establishing a voice and data connection with said user;
transmitting and receiving voice and communication data between said cellular phone and said user.

* * * * *